(12) United States Patent
Schulze et al.

(10) Patent No.: US 10,649,504 B2
(45) Date of Patent: May 12, 2020

(54) REMOVEABLE WALL

(71) Applicant: HEWLETT PACKARD ENTERPRISE DEVELOPMENT LP, Houston, TX (US)

(72) Inventors: James Jeffery Schulze, Houston, TX (US); Jeoff M Krontz, Tomball, TX (US); Daniel Ross Gonzales, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/070,777

(22) PCT Filed: Jan. 20, 2016

(86) PCT No.: PCT/US2016/014070
§ 371 (c)(1),
(2) Date: Jul. 19, 2018

(87) PCT Pub. No.: WO2017/127066
PCT Pub. Date: Jul. 27, 2017

(65) Prior Publication Data
US 2019/0033929 A1    Jan. 31, 2019

(51) Int. Cl.
*G06F 1/18* (2006.01)
*H05K 7/14* (2006.01)

(52) U.S. Cl.
CPC .............. *G06F 1/183* (2013.01); *G06F 1/181* (2013.01); *G06F 1/187* (2013.01); *H05K 7/1489* (2013.01)

(58) Field of Classification Search
CPC .......... G06F 1/183; G06F 1/187; G06F 1/181; H05K 7/1489; H05K 7/1487; H05K 7/1425; H05K 7/1418; G11B 33/128
See application file for complete search history.

(56) References Cited

U.S. PATENT DOCUMENTS

| | | | |
|---|---|---|---|
| 5,098,175 A | 3/1992 | Cooke et al. | |
| 5,142,447 A * | 8/1992 | Cooke ..................... | G06F 1/182 361/679.4 |
| 6,351,375 B1 | 2/2002 | Hsieh | |

(Continued)

FOREIGN PATENT DOCUMENTS

EP        2897128        7/2015

OTHER PUBLICATIONS

"Icy Dock Tougharmor," Retrieved from Internet Nov. 29, 2015, 4 pps., <http://www.newegg.com/Product/Product.aspx?Item=N82E16817994154 >.

(Continued)

*Primary Examiner* — Nidhi Thaker
(74) *Attorney, Agent, or Firm* — Fabian VanCott

(57) ABSTRACT

A computer chassis, including a number of removable walls wherein each removable wall includes a first side rail system comprising a number of first rails to receive a first size of a blade component, and a second side rail system comprising a number of second rails to receive a second size of a blade component. A removable wall for a chassis including a first side comprising a first number of and arrangement of rails and a second side comprising a second number of and arrangement of rails.

13 Claims, 3 Drawing Sheets

(56) References Cited

U.S. PATENT DOCUMENTS

| | | | | |
|---|---|---|---|---|
| 6,370,022 B1 * | 4/2002 | Hooper | ................... | G06F 1/184 |
| | | | | 312/223.2 |
| 6,580,604 B1 * | 6/2003 | McAnally | ............... | G06F 1/184 |
| | | | | 312/223.1 |
| 6,885,550 B1 | 4/2005 | Williams | | |
| 7,558,973 B2 * | 7/2009 | Huang | ................... | G06F 1/184 |
| | | | | 361/644 |
| 7,988,109 B2 * | 8/2011 | Chen | ....................... | G06F 1/187 |
| | | | | 248/201 |
| 2002/0063100 A1 | 5/2002 | Kwang | | |
| 2004/0037046 A1 | 2/2004 | Dittus | | |
| 2004/0159618 A1 | 8/2004 | Nguyen | | |
| 2007/0294777 A1 | 12/2007 | Kobayashi | | |
| 2008/0230496 A1 * | 9/2008 | Henderson | .......... | H05K 7/1489 |
| | | | | 211/26 |
| 2009/0194490 A1 * | 8/2009 | Chen | ....................... | G06F 1/187 |
| | | | | 211/41.12 |
| 2009/0284907 A1 * | 11/2009 | Regimbal | ............... | G06F 1/181 |
| | | | | 361/679.02 |
| 2010/0026148 A1 | 2/2010 | Zhang | | |
| 2014/0049897 A1 | 2/2014 | Hoss | | |

OTHER PUBLICATIONS

PCT/ISA/KR, International Search and Written Opinion, dated Oct. 26, 2016, PCT/US2016/014070, 14 pages.

\* cited by examiner

REMOVEABLE WALL

BACKGROUND

Chassis of a computing device hold a number of different blades that provide functionality to the computing device. These blades may be used for a number of functions such as data storage and data processing among other functions. These blades may come in different standardized or non-standardized dimensions.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
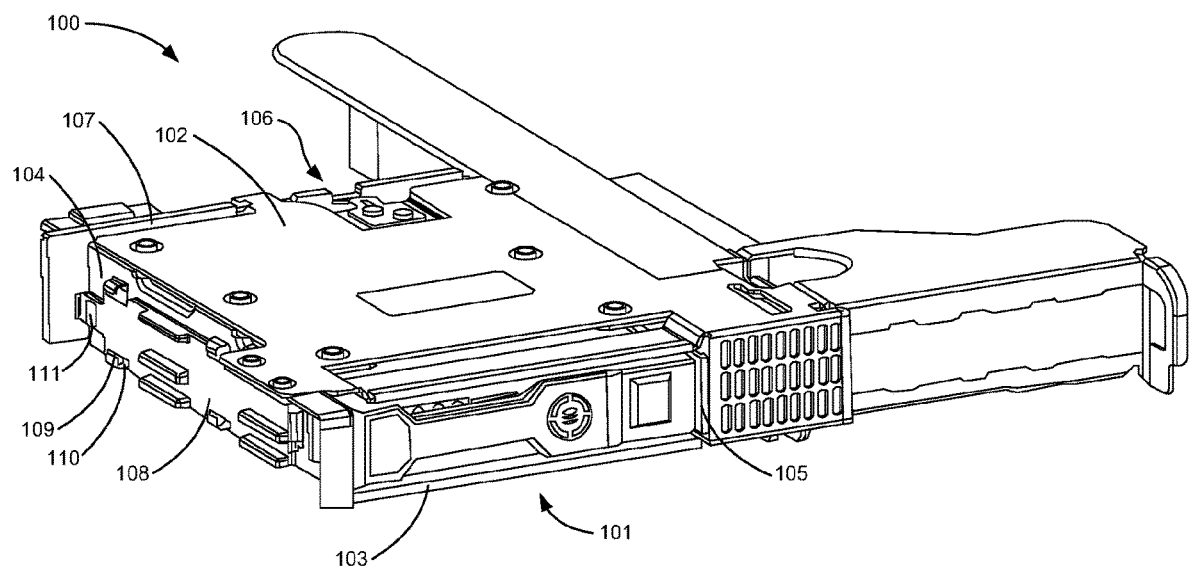
FIG. 1 is a perspective view of a computer chassis including a number of removable walls according to one example of the principles described herein.

As described above a chassis of a computing device may be used to house a number of blade devices. In an example, these blade devices may have set industry standard height, length and width dimensions. In an example, these blade devices may have arbitrary or non-industry standard height, length and width dimensions. In either case, a chassis fixes a blade device into the chassis as well as maintain a connection between the blade device and a backplane.

These chassis, however, are fixed in their internal sizes such that a certain sizes of blades may fit therein but that others have either too large of dimensions or too small of dimensions. The chassis may not be replaced readily with other sized chassis in order to fit new or alternative blade configurations. Indeed, as drive capacities continue to increase, 7 mm wide hard disk drives (HDDs), for example, may fit certain specified functionalities for a given user of the computing device. These types of drive may be used to mirror boot drives, for example and could replace other types of drives within a chassis. To mirror boot drives two 7 mm drives may be used. 7 mm drives may be added to the computing device as non-hot-plug (NHP) drives so as not to take up valuable real estate on fixed drive chassis on the front and rear of a computing device.

The present specification, therefore describes a computer chassis, including a number of removable walls wherein each removable wall includes a first side rail system comprising a number of first rails to receive a first size of a blade component, and a second side rail system comprising a number of second rails to receive a second size of a blade component.

The present specification further describes a blade device enclosure, including a chassis to selectively house a selective number of blade devices, a number of removable walls selectively coupled to opposing sides of the chassis wherein each of the removable walls include a first side comprising a first number of rails defined thereon to project into an interior wall of the chassis, and a second side comprising a second number of rails defined thereon to project into the interior wall of the chassis.

The present specification also describes a removable wall for a chassis including a first side comprising a first number of and arrangement of rails and a second side comprising a second number of and arrangement of rails.

As used in the present specification and in the appended claims, the term "blade" is meant to be understood broadly as any computing device or component of a computing device designed for a specific data processing task such as high density storage. In an example, a blade may be non-hot-swappable. In an example, a blade may be hot-swappable.

Additionally, as used in the present specification and in the appended claims, the term "a number of" or similar language is meant to be understood broadly as any positive number comprising 1 to infinity.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

FIG. 1 is a perspective view of a computer chassis (100) including a number of removable walls according to one example of the principles described herein. The computer chassis (100) may include a cavity (101) enclosed by a number of chassis walls (102, 103, 104, 105, 106): a top wall (102), a bottom wall (103), a left wall (104), a right wall (105), and a back wall (106). These chassis walls (102, 103, 104, 105, 106) are sized to fit a size of blade having a predefined width. In the present specification and in the appended claims, the width of any blade used to fit within the cavity (101) is defined as the measured dimension of the blade from below the top wall (102) and above the bottom wall (103) of the chassis (100). For convenience in explanation, an example size of a blade of 15 mm will be used to describe the width of the blade relative to the computer chassis (100). However, the present specification contemplates the use of any width of blade as well as any number of blades within the computer chassis (100) as will be explained in more detail below.

A backplane (107) may be secured to the back wall (106) of the computer chassis (100). A backplane (107) is a hardware part of the computer chassis (100) that includes logic paths, low-voltage distribution paths, and grounding paths that electrically connect a blade to, for example, a processor of the computing device associated with the computer chassis (100). As will be described in more detail below, the backplane (107) may be switched out based on the configuration of the blade or blades within the cavity (101).

The computer chassis (100) further includes a number of removable walls (108). In an example, the removable walls (108) may be secured to both the left wall (104) and right wall (105) of the computer chassis (100). The removable walls (108) may be made of a resilient material such as plastic that, when the removable walls (108) are bent, they return back to their unbent state thereby retaining their shape even after bending.

The removable walls (108) may be selectively secured to the left and right walls (104, 105) by a number of, for example, mounting clips (109). The mounting clips (109) may be extensions out of the computer chassis (100) that wrap over a portion of the removable walls (108) securing them to a respective side of the computer chassis (100). The mounting clips (109) may mate with a number of mounting clip grooves (110) defined in the body of the removable walls (108). In an example, sliding the removable walls (108) along the surface of the left or right walls (104, 105) of the computer chassis (100) will disengage the mounting clips (109) from the mounting clip grooves (110) releasing the removable walls (108) from the computer chassis (100).

The removable walls (108) may further include a number of locking tabs (not shown) that interface with a number of locking tab receiving holes (111) defined on the removable walls (108). The locking tabs may also be formed out of a protruding portion of the computer chassis (100) and may interface the removable walls (108) at a number of locations where the locking tab receiving holes (111) are defined in the removable walls (108). During operation, the portion of the removable walls (108) close to the locking tabs may be slightly bent outwards away from the walls in order to disengage the locking tabs of the computer chassis (100) from the locking tab receiving holes (111) defined in the removable walls (108).

Although the present specification describes the use of mounting clips (109), mounting clip grooves (110), locking tabs, and locking tab receiving holes (111) to secure the removable walls (108) to the sides (104, 105) of the computer chassis (100), any type of fasteners or fastening devices may be used to selectively secure the removable walls (108). The present specification, therefore, contemplates the use of these other fastening devices and the above described fasteners are described as one example.

Figure 2A:
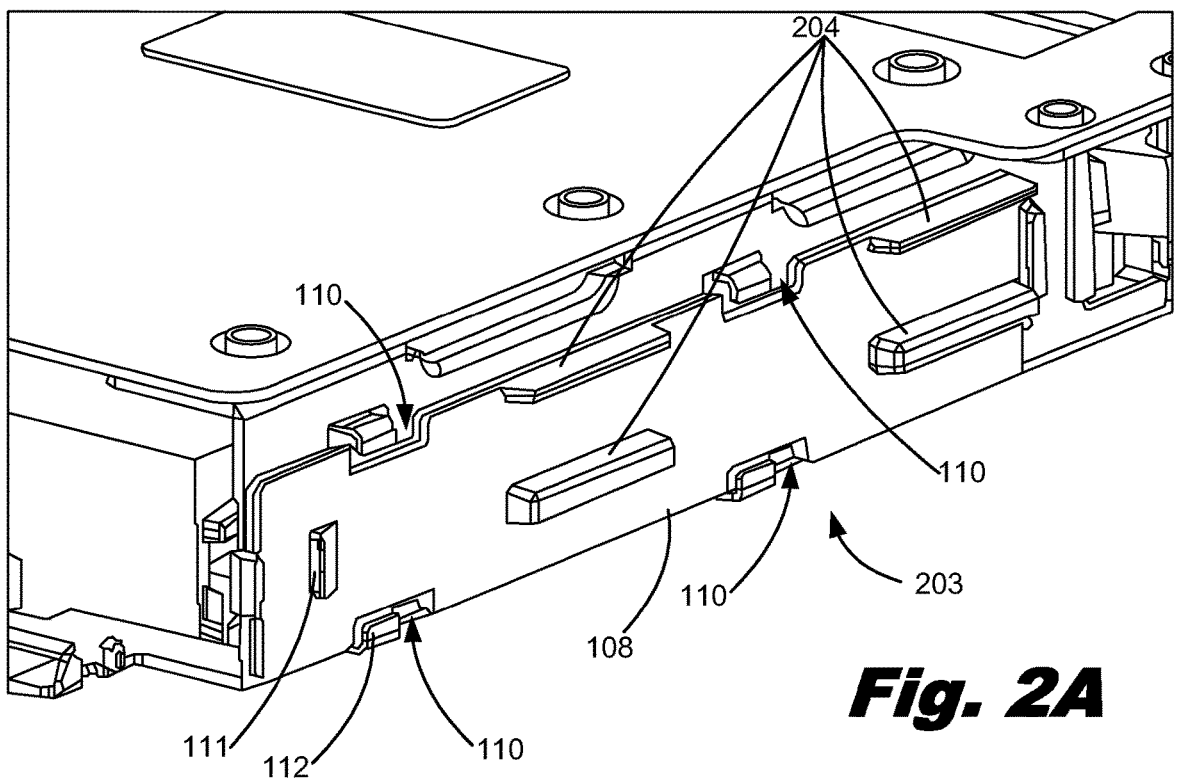
FIGS. 2A and 2B are perspective views of a removable wall according to an example of the principles described herein.
Figure 2B:
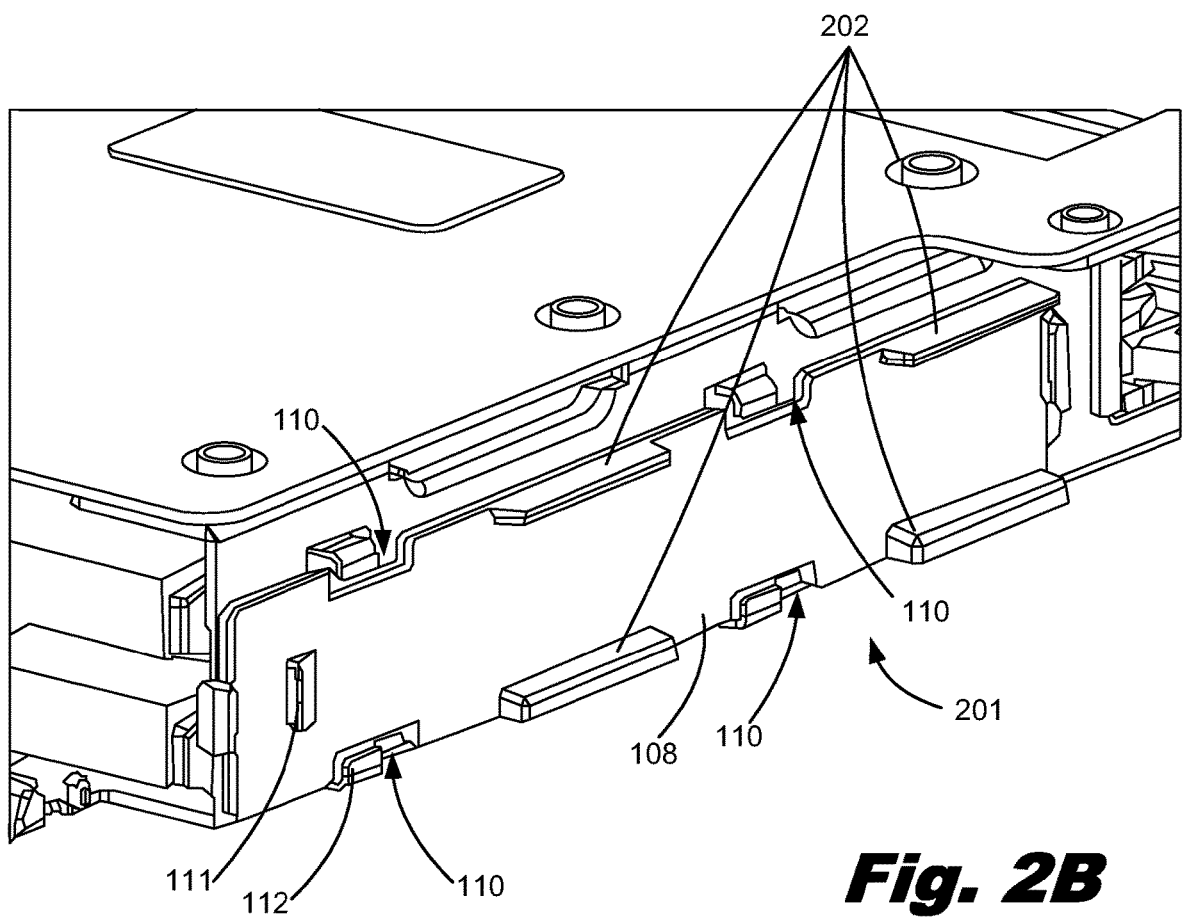

FIGS. 2A and 2B are perspective views of a removable wall (108) according to an example of the principles described herein. During operation, the removable walls (108) may be selectively engaged and disengaged to the computer chassis (100) with two different configurations. The removable walls (108) include a first side rail system (201) including a number of first rails (202) to receive a first size of a blade component. On a reverse side of the removable walls (108), the removable walls (108) include a second side rail system (203) including a number of second rails (204) to receive a second size of a blade component. These two rail systems (201, 203) provide for, at least, two alternative configurations of the blades within the cavity (FIG. 1, 101) of the computer chassis (FIG. 1, 100).

As an example, if the cavity (FIG. 1, 101) of the computer chassis (FIG. 1, 100) was sized to fit a 15 mm blade, the side of the removable walls (108) having the first side rail system (201) with the first rails (202) may be secured to each side of the computer chassis (FIG. 1, 100). The computer chassis (FIG. 1, 100) may have a hole defined in these sides (FIG. 1, 104, 105) of the computer chassis (FIG. 1, 100) such that the first rails (202) may protrude into the cavity (FIG. 1, 101) of the computer chassis (FIG. 1, 100) and engage with, in this example, the 15 mm wide blade. If the 15 mm blade was to be removed and replaced with two 7 mm blades, the second side rail system (203) may be used to accommodate the cavity (FIG. 1, 101) of the computer chassis (FIG. 1, 100) for such a configuration. In this case, the removable walls (108) may be flipped over such that the side of the removable walls (108) having the second side rail system (203) with the second rails (204) may be placed against the walls (FIG. 1, 104, 105) of the computer chassis (FIG. 1, 100) In this configuration, the second rails (204) are also protruding through the walls (FIG. 1, 104, 105) of the computer chassis (FIG. 1, 100). The protruding second rails (204) may engage with each of the two 7 mm blades thereby providing rails onto which the 7 mm blades may rest.

FIG. 2A shows the second rails (204) of the second side rail system (203) in an inverted state. This is because the first rails (202) of the first side rail system (201) are on the opposite side of the removable wall (108) in the view show in FIG. 2A. Conversely, FIG. 2B show the first rails (202) of the first side rail system (201) in an inverted state. The first rails (202) are inverted because the second rails (204) of the second side rail system (203) are on the opposite side of the removable wall (108) in the view shown in FIG. 2B. Consequently, either the first side rail system (201) or the second side rail system (203) may be presented against the walls (104, 105) of the computer chassis (FIG. 1, 100) with the opposite side rail system inverted and protruding away from the computer chassis (FIG. 1, 100).

Figure 3A:
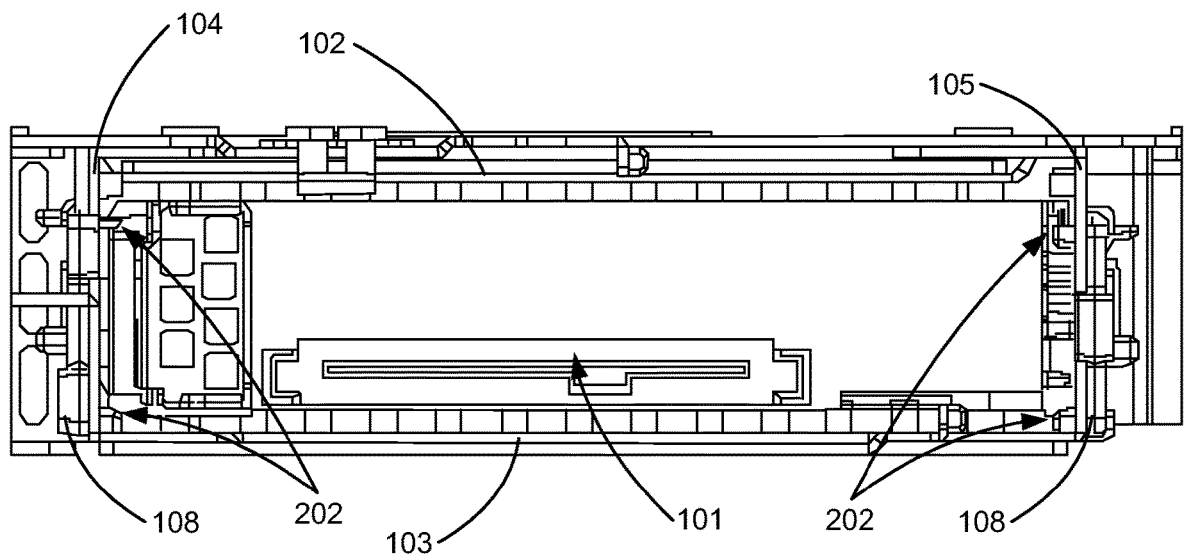
FIGS. 3A and 3B are front views of a computer chassis of FIG. 1 showing the first rails and second rails, respectively, protruding through the walls of the computer chassis.
Figure 3B:
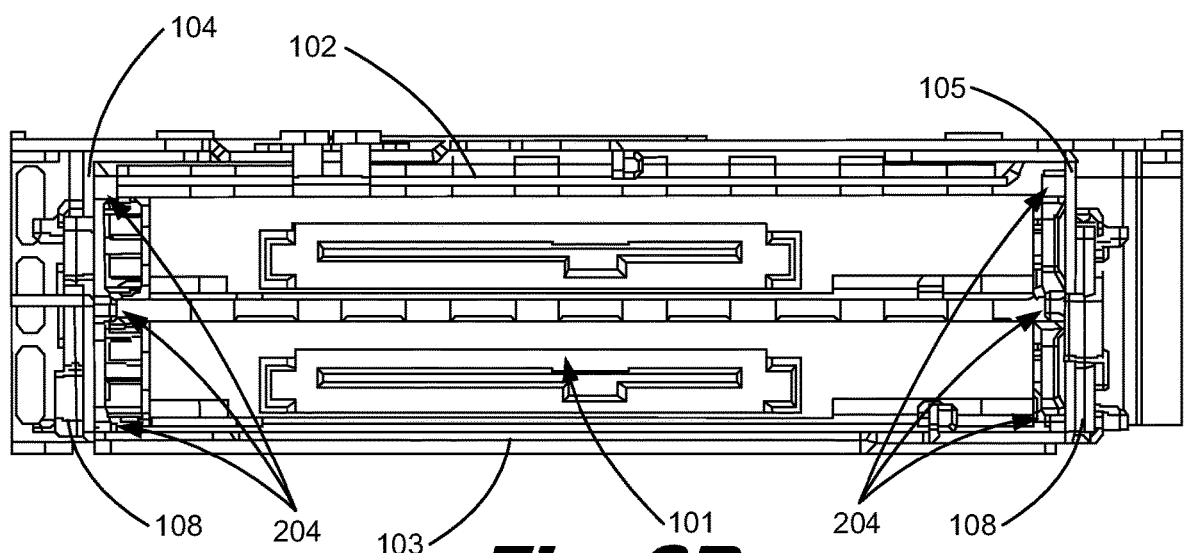

FIGS. 3A and 3B are front views of a computer chassis (100) of FIG. 1 showing the first rails (202) and second rails (204), respectively, protruding through the walls (104, 105) of the computer chassis (100). In FIGS. 3A and 3B the removable walls (108) are in the two different configurations as described above. In this example, FIG. 3A shows the removable walls (108) implementing the first side rail system (201) with its first rails (202) extending through the computer chassis (FIG. 1, 100) and engaging a blade (301). In an example, FIG. 3B shows the removable walls (108) flipped over such that the removable walls (108) are implementing the second side rail system (203) with its second rails (204) extending through the computer chassis (FIG. 1, 100) and engaging a plurality of blades (301). Thus, the cavity (101) of the computer chassis (100) may selectively hold a single or multiple blades depending on the configuration of the removable walls (108).

FIGS. 1-3B depict a blade cavity (101) selectively housing a single blade and a number of blades based on the configuration of the removable walls (108). Other examples exist where the cavity (101) may house a first plurality of blades in a first configuration and house a second plurality of blades in a second configuration. In this example, the second plurality of blades may have a larger number of blades than the first plurality of blades. As such, each side of the removable walls (108) may be formed to selectively house within the cavity (101) any alternative number of blades and the present application contemplates a removable wall (108) that can fit any number of any width of a blade.

As described above, the removable walls (108) may have a number of mounting clip grooves (110) defined therein that engage with a number of mounting clips (109) coupled to the walls (FIG. 1, 104, 105) of the computer chassis (100). The mounting clip grooves (110) may allow the mounting clips (109) to first interface with the removable walls (108) and then when the removable walls (108) are moved in a direction, seat against the removable walls (108) thereby securing the removable walls (108) to the walls (FIG. 1, 104, 105) of the computer chassis (100). In an example, the mounting clip grooves (110) provide an interface to a mounting groove rail (FIGS. 2A and 2B 112) for the mounting clips (109) to engage. The mounting groove rails (FIGS. 2A and 2B, 112) may be sized such that the removable walls (108) may seat tightly against the walls (FIG. 1, 104, 105) of the computer chassis (100) in either the first or second configuration as described above.

During operation of the computer chassis (100), a user may determine whether a blade is to be removed and replaced with any differing width or number of blades. The user may select from any different type of removable wall (108) to fit any type of blade or blades being placed in the cavity (101) of the computer chassis (100). In one example, a user may select a removable wall (108) based on anticipated changes that may be made in the future. As an example, a user may install a removable wall (108) that has a configuration to hold a first blade placed in the computer chassis (100). However, the user may further select the removable wall (108) that supports a second configuration in anticipation for removing the blade and replacing it with another blade having a specific width or a number of other blades also having a specific width. Proceeding with the example presented above, a user may select a removable wall (108) that, in a first configuration, supports a 15 mm wide blade. The user may also anticipate that that 15 mm wide blade may be switched out for two separate 7 mm blades. In anticipation for this, the user may select a removable wall (108) that accommodates for the first configuration but that, when flipped, also accommodates for the second configuration for two 7 mm blades being housed in the computer chassis (100).

A user may place a selected removable wall (108) against one side of the computer chassis (100) such that the mounting clips (109) are each placed within the mounting clip grooves (110) in anticipation for engagement with the mounting groove rails (FIGS. 2A and 2B 112). As the mounting clips (109) engage with the mounting groove rail (FIGS. 2A and 2B 112), the locking tabs defined in the computer chassis (100) may fit into the locking tab receiving holes (111) defined in the removable walls (108). Once the locking tabs are seated in the locking tab receiving holes (111), the removable wall (108) is positioned to receive within the cavity (101) of the computer chassis (100).

As described above, in an example, the first rails (202) and second rails (204) may protrude through the walls (104, 105) of the computer chassis (100) and into the cavity (101). In an example, the computer chassis (100) may have predefined holes defined in the computer chassis (100) to receive the first rails (202) and the second rails (204). In an example, the computer chassis (100) may have a single hole defined therein to fit any size and type of rails that may be defined on the removable walls (108) as describe above.

As described above, the computer chassis (100) may further include a backplane (FIG. 1, 107). As described above, the backplane (107) is a hardware part of the computer chassis (100) that includes logic paths, low-voltage distribution paths, and grounding paths that electrically connect a blade to, for example, a processor of the computing device associated with the computer chassis (100). These logic paths, low-voltage distribution paths, and grounding paths may provide this electrical communication to the processor for each individual blade. As a consequence of switching out the type, size, or number of blades in the cavity (FIG. 1, 101) of the computer chassis (FIG. 1, 100), a different backplane may be switched out as well. Continuing with the example, above, a 15 mm blade in the cavity (FIG. 1, 101) of the computer chassis (FIG. 1, 100) may be a single backplane interface for the single blade. As the 15 mm blade is switched out by two 7 mm blades by switching the removable walls (108) as described above, a new backplane may be used to replace the old backplane (107). Specifically, the new backplane (107) may provide two individual electrical connectors to electrically couple each of the two 7 mm blades to the processor. Again, any number of electrical connectors on the backplane may be used based on the number, configuration, and size of the blades present in the cavity (101) of the computer chassis (100) at any point in the switching the blades.

The design of the removable walls (108), described above, allows for at least two different blade configurations within the computer chassis (100). The removable walls (108) also allow for a quick change in the configuration by simply removing an old blade, flipping the removable walls (108), and inserting a number of new blades into the computer chassis (100). The removable walls may be provided to a user along with a computer chassis (100) or blades that are to be inserted into the computer chassis (100). In the same physical footprint, a single computer chassis (100) may be used for a number of other blade configurations without removing and replacing the computer chassis (100).

The preceding description has been presented to illustrate and describe examples of the principles described. This description is not intended to be exhaustive or to limit these principles to any precise form disclosed. Many modifications and variations are possible in light of the above teaching.

What is claimed is:

1. A computer chassis, to selectively house a selective number of computing devices, comprising:
    a number of removable walls, selectively coupled to opposing sides of the computer chassis, wherein the computer chassis includes a number of mounting clips into which each of the removable walls may be selectively secured to the computer chassis;
    wherein each removable wall comprises:
        a first side rail system comprising a number of first rails to receive a first size of a computing device; and
        a second side rail system comprising a number of second rails to receive a second size of a computing device.

2. The computer chassis of claim 1, wherein each of the removable walls are reversible to selective fit into the chassis the first and second size blade components.

3. The computer chassis of claim 1, wherein the first rails of the first side rail system fit a 15 mm wide blade component.

4. The computer chassis of claim 1, wherein the second rails of the second side rail system fit two 7 mm wide blade components.

5. The computer chassis of claim 1, wherein the removable walls are made of a resilient material.

6. The computer chassis of claim 1, wherein the chassis further comprises a number of locking tabs that interconnect with a number of respective locking tab receiving holes defined in the number of removable walls.

7. A blade device enclosure, comprising:
    a chassis to selectively house a selective number of blade devices;
    a number of removable walls selectively coupled to opposing sides of the chassis, wherein the chassis includes a number of mounting clips into which each of the removable walls may be selectively secured to the chassis;
    wherein each of the removable walls comprise:
        a first side comprising a first number of rails defined thereon to project into an interior wall of the chassis; and
        a second side comprising a second number of rails defined thereon to project into the interior wall of the chassis.

8. The blade device enclosure of claim 7, wherein abutting the first side of the removable walls against the chassis causes the first number of rails to project into the interior wall of the chassis allowing for a first size of blade device to be mounted into the chassis.

9. The blade device enclosure of claim 7, wherein abutting the second side of the removable walls against the chassis causes the second number of rails to project into the interior wall of the chassis allowing for a second size of blade device to be mounted into the chassis.

10. The blade device enclosure of claim 7, wherein the chassis further comprises a number of locking tabs extending from the chassis that engage a respective number of locking tab receiving holes defined in each of the removable walls to secure the number of removable walls in a locked position.

11. The blade device enclosure of claim 10, wherein each of the removable walls are made of a pliable material to bend the number of removable walls away from the number of locking tabs and disengage the removable walls from the chassis.

12. A removable wall for a chassis, the chassis to selectively house a selective number of blades and the removable wall to selectively couple to opposing sides of the chassis, comprising:
   a first side comprising a first number of and arrangement of rails to project into an interior wall of the chassis;
   a second side comprising a second number of and arrangement of rails to project into the interior wall of the chassis; and
   a number of indentions to receive a number of respective mounting clips of the chassis to secure the removable wall to the chassis.

13. The removable wall of claim 12, wherein the first number of and arrangement of rails is different from the second number of and arrangement of rails.

\* \* \* \* \*